United States Patent [19]
Namiki

[11] Patent Number: 4,555,669
[45] Date of Patent: Nov. 26, 1985

[54] NOISE REDUCTION BY LINEAR INTERPOLATION USING A SINGLE SAMPLE-AND-HOLD CIRCUIT

[75] Inventor: Yasuomi Namiki, Yokohama, Japan

[73] Assignee: Victor Company of Japan, Yokohama, Japan

[21] Appl. No.: 632,875

[22] Filed: Jul. 20, 1984

[30] Foreign Application Priority Data

Jul. 21, 1983 [JP] Japan .................................. 58-133128
Aug. 25, 1983 [JP] Japan .................................. 58-155668

[51] Int. Cl.$^4$ .............................................. H03F 1/26
[52] U.S. Cl. ...................................... 330/149; 330/51; 328/165; 307/542
[58] Field of Search ................ 307/352, 353; 328/151, 328/162, 163, 164, 165; 330/9, 51, 149; 381/94; 455/223, 224

[56] References Cited
U.S. PATENT DOCUMENTS 4,305,042 12/1981 Tanaka et al. .................. 328/165 X
4,311,963 1/1982 Watanabe et al. .............. 328/147 X
4,335,322 6/1982 Tanaka et al. ...................... 307/542

FOREIGN PATENT DOCUMENTS 0103385 3/1984 European Pat. Off. .
2262560 6/1974 Fed. Rep. of Germany .
2929030 2/1980 Fed. Rep. of Germany .

OTHER PUBLICATIONS

Patent Abstracts of Japan, vol. 6, No. 182, Sep. 18, 1982 & JP-A-57-095728 (Nippon Gakki Seizo K.K.) 14-0-6-1982.

Primary Examiner—Eugene R. LaRoche
Assistant Examiner—Steven J. Mottola
Attorney, Agent, or Firm—Lowe, King, Price & Becker

[57] ABSTRACT

In a noise reduction circuit, a sample-and-hold circuit operating on a tracking mode is sampled in response to the occurrence of a noise impulse. The voltage sampled is stored in the capacitor of the sample-and-hold. A slope detector is responsive to the capacitor voltage for generating an output representative of the rate of variation of the capacitor voltage. A voltage-to-current converter is connected between the output of the slope detector and the capacitor for converting the voltage to a corresponding current and injecting the current to the capacitor when the rate of variation is positive and draining the current from the capacitor when the rate is negative.

6 Claims, 10 Drawing Figures

NOISE REDUCTION BY LINEAR INTERPOLATION USING A SINGLE SAMPLE-AND-HOLD CIRCUIT

CROSS-REFERENCES TO COPENDING APPLICATIONS

The present invention is related to the following copending U.S. patent applications:

(1) Ser. No. 516,242, filed July 21, 1983, by Ishigaki et al, titled "circuit for Reconstructing Noise-Affected Signals";

(2) Ser. No. 517,985, filed July 29, 1983, by Y. Ishigaki, titled "Circuit Arrangement for Reconstructing Noise-Affected Signals";

(3) Ser. No. 585,925, filed Mar. 2, 1983, by Y, Ishigaki et al, titled "Impulse noise reduction by linear inerpolation having a deemphasis characteristic"; and (4) Ser. No. 585,926, filed Mar. 2, 1984, by Y. Ishigaki et al, titled "Noise reduction by linear interpolation having immunity to white noise".

All of the copending applications are assigned to the same assignee as the present invention.

BACKGROUND OF THE INVENTION

The present invention relates to a noise reduction circuit of the type where noise-affected portion of an information signal is linearly interpolated.

Linear interpolation techniques are known in the art as a means for reconstructing the portion of audio signals which are disrupted by a noise impulse, as shown and described in the above listed copending U.S. applications. The linear interpolation approach employed in the aforesaid applications involves the use of two sample-and-hold circuits; one connected in a circuit between input and output terminals for generating a voltage which follows the waveform of the input signal during tracking modes and storing a voltage immediately prior to the occurrence of a noise impulse and subsequently performing a charge or discharge action during a sampling mode and the other for generating an interpolation voltage representing the rate of variation of the information signal to allow the first one to perform the charge or discharge action in accordance with the interpolation voltage.

SUMMARY OF THE INVENTION

An object of the present invention is to eliminate the need for the second sample-and-hold circuit to provide a simplified noise reduction circuit.

The noise reduction circuit of the present invention comprises a noise detector connected to an input terminal to which an information signal is applied for detecting a noise impulse introduced therein and generating a sampling pulse time-coincident with the portion of the signal affected by the impulse. A sample-and-hold circuit, connected between the input and output terminals, includes a capacitor and a switch for passing the information signal to the output terminal in the absence of the sampling signal. A slope detector is responsive to a voltage developed in the capacitor for generating a voltage representative of the rate of variation of the capacitor voltage. Further provided is a voltage-to-current converter connected between the output of the slope detector and the capacitor for converting the voltage to a corresponding current and injecting the current to the capacitor when the rate of variation is positive and draining the current from the capacitor when the rate is negative.

In a preferred embodiment, the slope detector comprises a first differentiator connected to the sample-and-hold circuit and a second differentiator connected to the first differentiator. The outputs of the first and second differentiators are combined and applied to the voltage-to-current converter. The first differentiator has a time constant value greater than $1/(2\pi fm)$, where fm represents the highest frequency of the information signal so that the output of the first differentiator becomes substantially constant when the information signal has a frequency lower than $1/(2\pi T_1)$ where $T_1$ is the time constant value. The slope detector further includes an amplifier for amplifying the combined differentiator output. The amplification gain of this amplifier is such that when the frequency of the information signal is lower than $1/(2\pi T_1)$ a voltage at the output of the amplifier substantially equals the voltage developed in the capacitor. The voltage-to-current converter can advantageously be constituted by an impedance element, or resistor.

BRIEF DESCRIPTION OF THE DRAWINGS

The present invention will be described in further detail with reference to the accompanying drawings, in which.

DETAILED DESCRIPTION

Figures 1, 3:
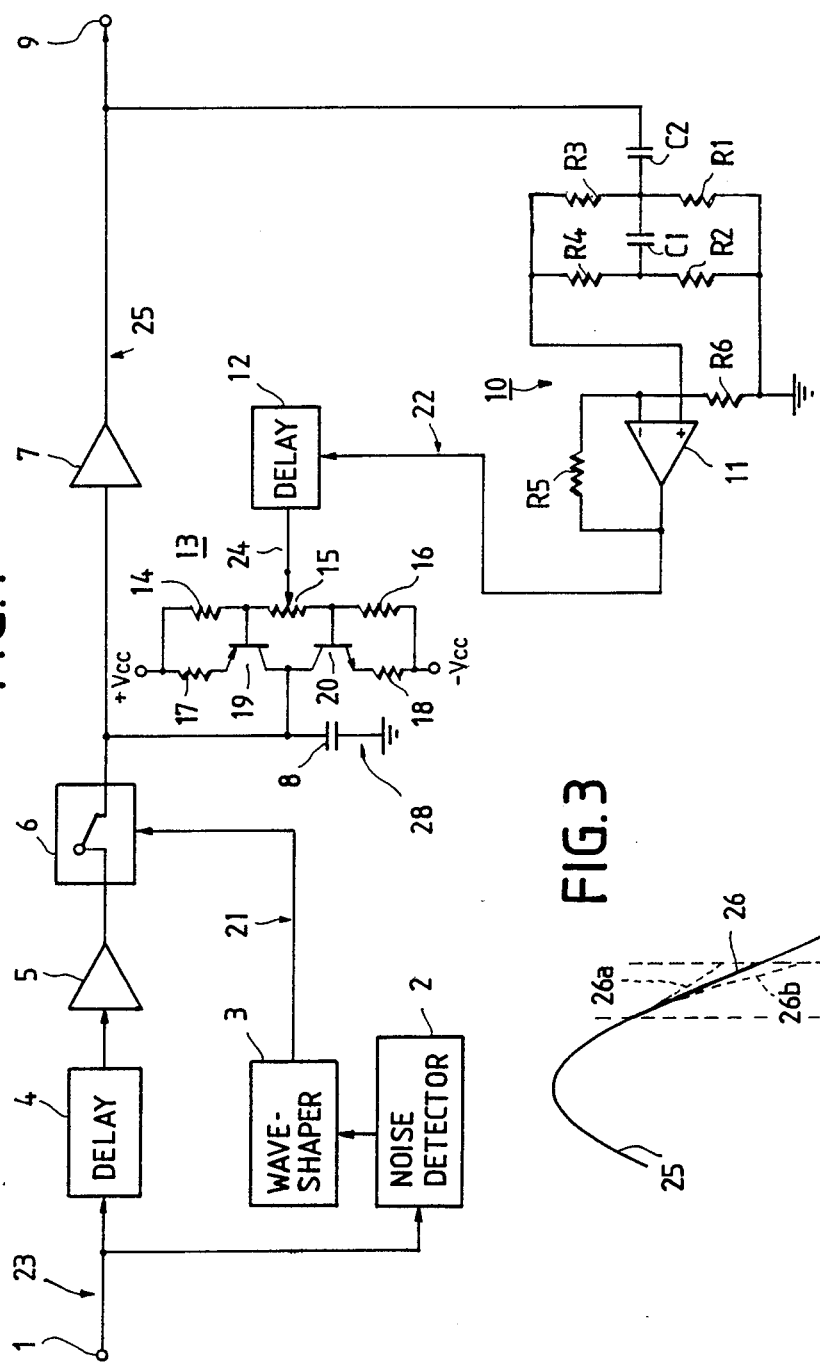
FIG. 1 is a block diagram of the noise reduction circuit according to a first embodiment of the invention.
FIG. 3 is an illustration of the waveform of an interpolated signal describing the effect of the loop gain on the noise-affected period.

Referring now to FIG. 1, there is shown a noise reduction circuit according to a first embodiment of the present invention. The signal applied to an input terminal 1 is an audio signal which may be derived from an audio track of a videotape, the input signal being applied to a noise detector 2. A noise impulse as shown at 20 in FIG. 2, by which the signal is disrupted, is detected and a pulse of a duration T equal to the disrupted portion is produced by noise detector 2 and applied to a waveshaper 3 for generating a sampling pulse having sharp edges as shown at 21 in FIG. 2.

The audio signal is also applied through a delay circuit 4, an amplifier 5 having a low output impedance, an electronic switch 6 and through a second amplifier 7 having a high input impedance to an output terminal 9 to which a noise-suppressed signal is delivered. Switch 6 is of a normally closed contact type which cuts off the circuit between input and output terminals 1 and 9 in response to a sampling pulse provided by waveshaper 3. The audio signal is delayed in the circuit 4 so that its noise-affected portion is time coincident with the sampling pulse.

To a node between switch 6 and amplifier 7 is connected a "holding" capacitor 8 which is grounded.

Since the switch 6 is normally closed in the absence of noise impulses, capacitor 8 is normally charged to a voltage level that varies with the waveform of the input signal and "freezes" the voltage which appeared immediately prior to the switch being opened in response to sampling pulse.

To the output of amplifier 7 is connected a slope detector 10. This detector comprises a first differentiator formed by capacitor C1 and resistor R1, and a second differentiator formed by capacitor C2 and resistor R2. The first differentiator differentiates the output of amplifier 7 so that its output is 90° out of phase with the input signal. The second differentiator is connected to the node between capacitor C1 and resistor R1 to provide double differentiator of the audio output. A first differentiator output appears at a node between capacitor C1 and resistor R1 and a second differentiator output appears at a node between capacitor C2 and resistor R2, the voltages appearing at these nodes being combined by resistors R3 and R4 in such a proportion that, as will be described, a voltage developed in capacitor 8 during hold mode adequately interpolates the disrupted portion of the audio signal.

The combined differentiators output is applied to the positive input of an operational amplifier 11 which constitutes a noninverting amplifier with a feedback resistor R5 and a bias resistor R6 the junction of which is coupled to the negative input of amplifier 11.

The output of amplifier 11 represents an estimated value of the slope between the noise-disrupted portion of the audio signal, this output being delayed by a delay circuit 12 and fed to the input of a voltage-to-current converter, or bipolar constant current source 13 whose output is connected to capacitor 8. Delay circuit 12 can be dispensed with if the sampling pulse lasts as long as 30 microseconds since the feedback loop has an inherent delay time of the order of microseconds.

The operation of the noise reduction circuit is as follows. In the absence of impulsive noise, the output of the constant current source 13 sees a low impedance path through the output of amplifier 5 via switch 6 which is in a closed state. Thus, the voltage on capacitor 8 is not influenced under the effect of the constant current source during such modes and capacitor 8 allows the voltage to follow the waveform of the input audio signal. Slope detector 10 generates an output shown at 22 in FIG. 2 which is out of phase with the input waveform 23 and is delayed by an amount t in delay circuit 12 providing a delayed output 24 which drives the constant current source 13. This constant current source includes a pair of transistors 19 and 20 of opposite conductivity types connected in series through resistors 17 and 18 to positive and negative voltage sources, with the junction between them being coupled to capacitor 8. A biasing resistor network comprising a series combination of resistors 14, 15 and 16 biases transistors 19 and 20 with positive and negative voltages, respectively. Resistor 15, which is a potentiometer whose tap point is coupled to the output of delay circuit 12, is adjusted to provide a zero ampere current to capacitor 8 when the input to the constant current source 13 is at zero voltage level.

Figure 2:
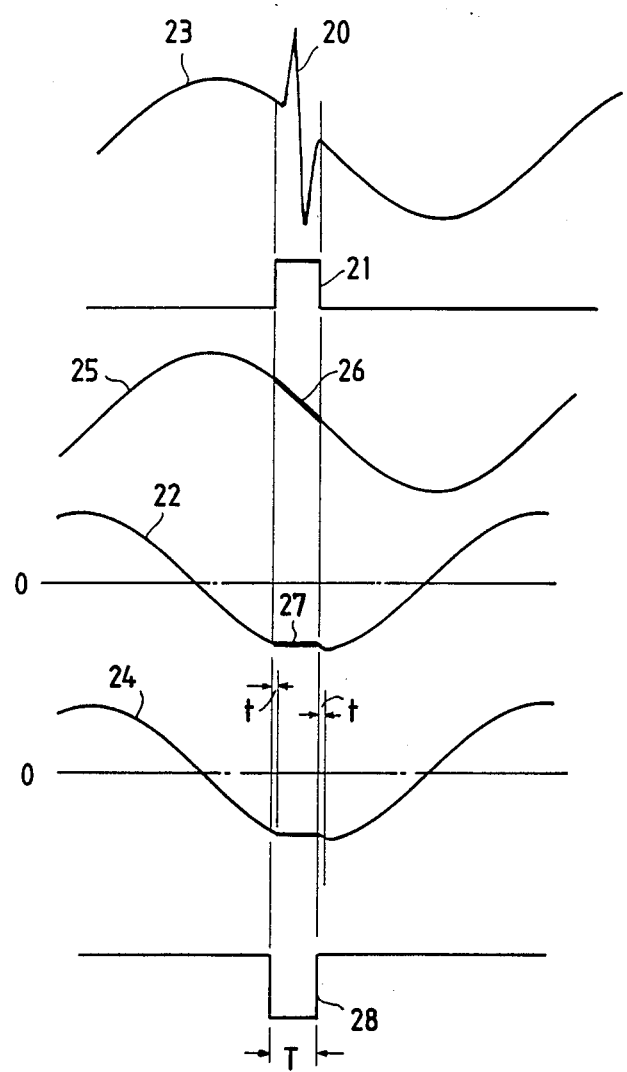
FIG. 2 is a waveform diagram associated with the first embodiment.

In response to noise impulse 20 that is introduced to the input audio signal 22, FIG. 2, sampling pulse 2 is applied to switch 6 time coincident with the noise impulse to cut off the channel between input and output terminals 1 and 9. The voltage developed in capacitor 8 at the moment immediately prior to the leading edge of sampling pulse is sampled and frozen in that capacitor. Since this voltage represents the location of the noise impulse in the excursion of the waveform, the input signal fed through amplifier 7 to slope detector 10 indicates whether the disrupted portion is to be interpolated with a positive or negative slope. In the illustrated example, the noise impulse is assumed to have occurred on a negative slope of the audio signal. Immediately prior to the occurrence of sampling pulse 21, slope detector 10 is generating a negative voltage. At the moment the sampling pulse is generated, slope detector 10 continues its differentiating action, so that it generates a negative voltage. Due to the delay time t of the loop, the current to be injected to capacitor 8 is derived from a voltage which occurred in capacitor 8 t period earlier than the time the sampling pulse occurred. The negative voltage drives transistor 20 into conduction and drains a current from capacitor 8 by an amount proportional to the negative voltage. Thus, the voltage at the output of amplifier 7, shown at 25 in FIG. 2, begins to decrease linearly as indicated by a thick line 26. The loop's delayed action enables the slope detector to respond to a successive change in voltage output from amplifier 7 by generating a voltage of a constant value as indicated by a thick line 27. This process is repeated until the end of the period T. As a result, the current drained from capacitor 8 will appear as indicated at 28, and the noise-affected portion of the waveform 25 is linearly interpolated by slope voltage 26.

If the noise impulse should occur on a positive slope of the input waveform, slope detector 10 will generate a positive interpolation voltage which turns on transistor 19 to inject a current into capacitor 8.

The loop gain of the closed loop interpolation is appropriately determined by the ratio $(R5+R6)/R6$, for example. If the loop gain is too low, the voltage section 26 would follow an upper path indicated by a broken-line 26a in FIG. 3 and if too high, the voltage would follow a lower path indicated by a broken line 26b.

Figure 4:
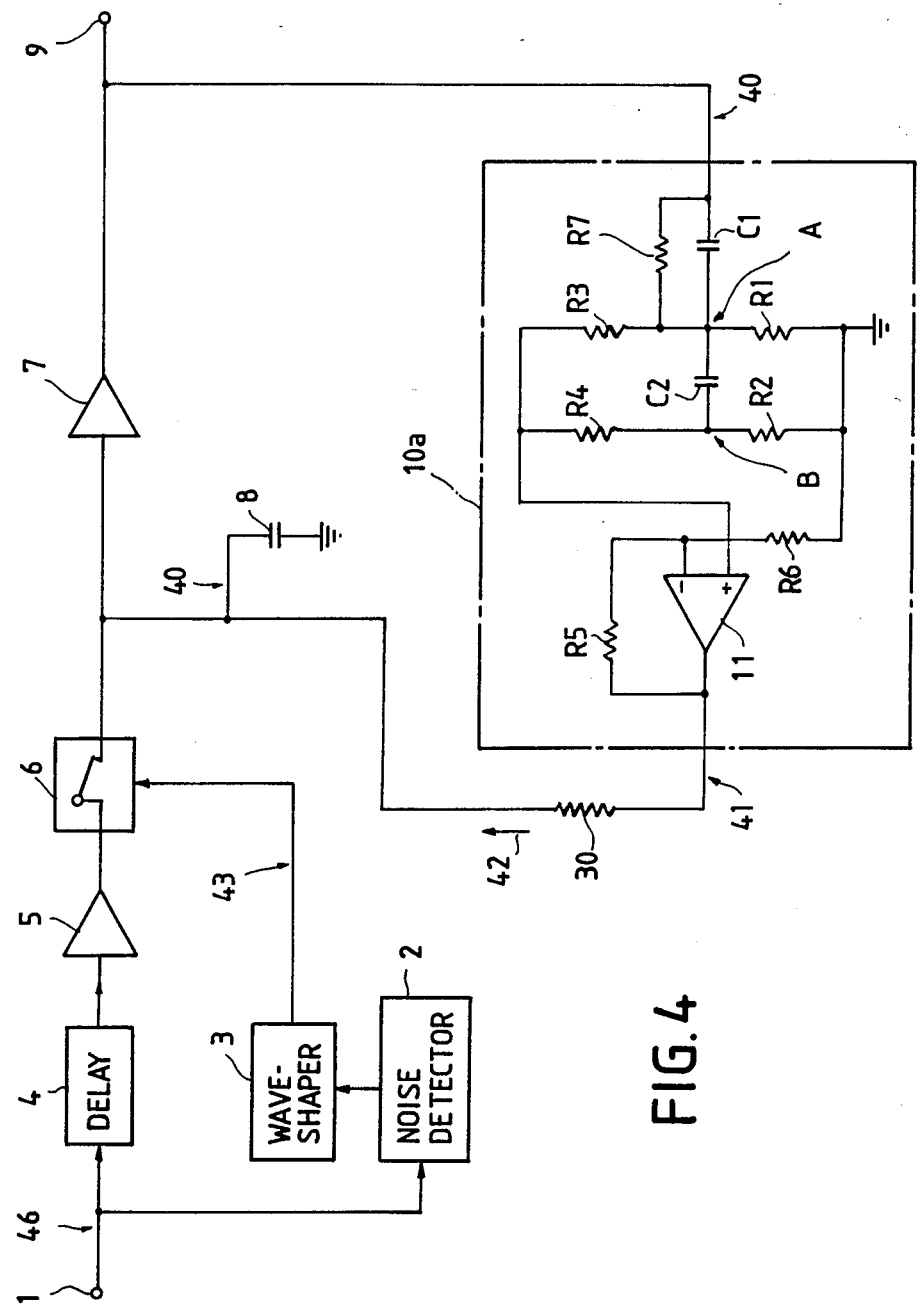
FIG. 4 is a block diagram of the noise reduction circuit according to a second embodiment of the invention.

In a second embodiment of the present invention, shown in FIG. 4, the constant current source is formed by a single impedance element or resistor 30 and slope detector 10a differs from that shown in FIG. 1 by the inclusion of a resistor R7 connected in parallel with capacitor C1.

For lower frequency signals, resistor R7 and capacitor C1 are dominant factors in determining the time constant value of the first differentiator and for higher frequency signals, resistor R1 becomes dominant in addition to R7 and C1 so that the first differentiator has two time constant values $T_1$ and $T_2$ for lower and higher frequency signals, respectively, as given below:

$$T_1 = R \times C1$$

$$T_2 = C1(R7 \times R1)/(R7+R1)$$

If R7 is much greater than R1, $T_2$ is given by:

$$T_2 = R1 \times C1$$

Figure 5A:
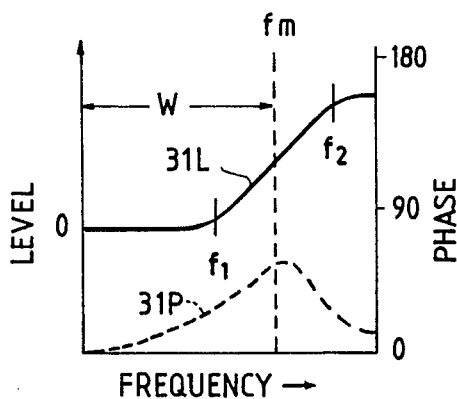
FIGS. 5a to 5e are graphic illustrations of various operating characteristics of the elements in the slope detector of FIG. 4.
Figure 5B:
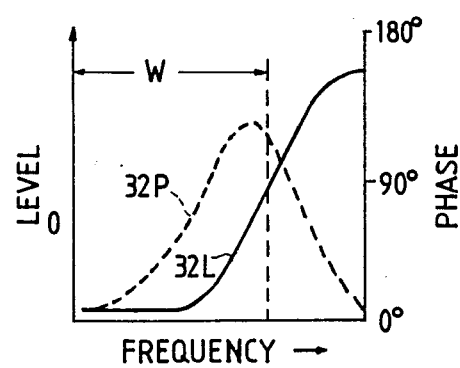

According to the present invention, time constant $T_2$ is much smaller than the period $1/(2\pi fm)$, where fm represents the highest frequency of the audio spectrum. On the other hand, time constant $T_1$ is greater than $1/(2\pi fm)$ so that the level-vs-frequency characteristic measured at node A of the first differentiator is made flat over the range below the frequency $f_1 = 1/(2\pi T_1)$ and flat over the range above the frequency $f_2=1/(2\pi T_2)$ as shown at 31L in FIG. 5a. The phase-vs-frequency characteristic indicates a peak at a point close to the highest frequency value fm and the phase gradually increases with frequency from zero degree within the audio frequency spectrum W. On the other hand, the level-vs-frequency and phase-vs-frequency characteristics of the second differentiator measured at node B show similar tendencies to those of FIG. 5a as indicated at 32L and 32P in FIG. 5b, respectively.

The resistance values of R3 and R4 are sufficiently high in comparison with the resistances R1, R2 and R4 to minimize their effects on the time constant values of the two differentiators.

Figure 5C:
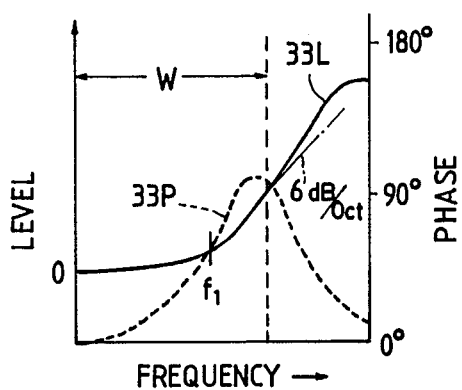

The loop gain of the system, which is determined exclusively by the ratio (R5+R6)/R6, is determined so that the output level of amplifier 11 is substantially equal to the voltage developed in capacitor 8 when the frequency of the audio signal is lower than $f_1$. The resultant level-vs-frequency characteristic of slope detector 10a, as shown at 33L in FIG. 5c, shows a tendency to approach the 0-dB level with a decrease in frequency. The phase-vs-frequency characteristic, shown at 33P, has a near-90° peak value at a point slightly lower than fm. The level-vs-frequency and phase-vs-frequency characteristics measured at capacitor 8 are flat over the frequency spectrum W and beyond as indicated at 34L and 34P, respectively, in FIG. 5d.

Figure 5D:
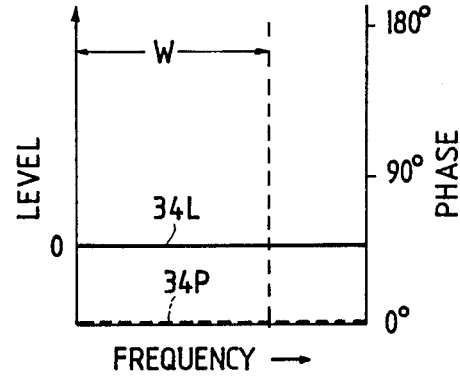
Figure 5E:
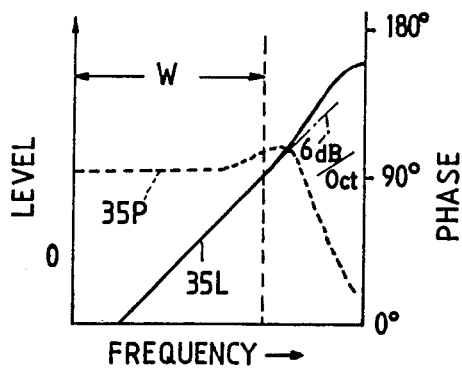

Since the current flowing through resistor 30 is represented by the difference between the output voltage of slope detector 10a and the voltage on capacitor 8 divided by the resistance value of resistor 30, the level-vs-frequency and phase-vs-frequency characteristics of this current are represented by the differences between the level-vs-frequency and phase-vs-frequency curves of FIG. 5c and those of FIG. 5d, these characteristics being shown at 35L and 35P in FIG. 5e.

Figure 6:
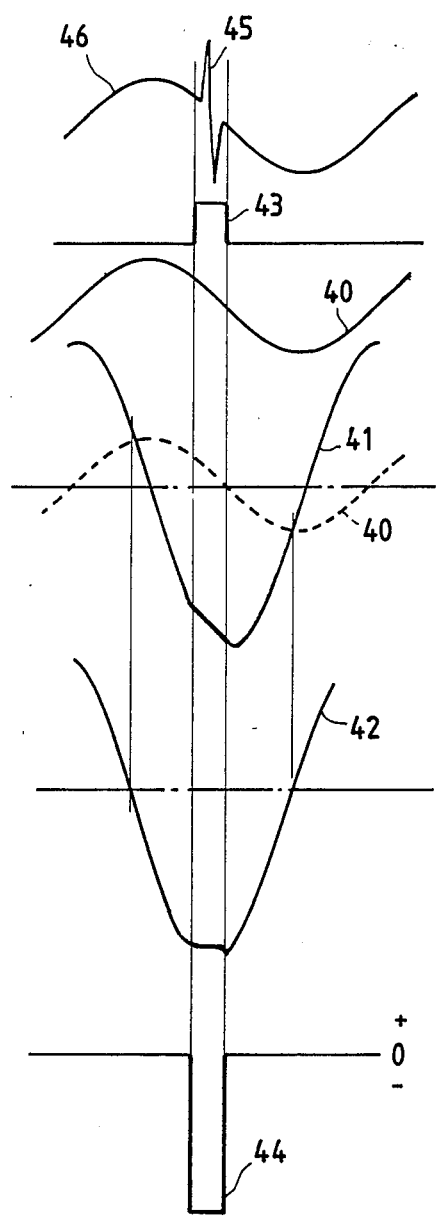
FIG. 6 is a waveform diagram associated with the second embodiment.

The voltage waveform shown at 40 in FIG. 6 is a signal delivered to output terminal 9 and the difference between it and an output voltage 41 of slope detector 10a is thus taken and this difference, shown at 42, is proportional to the gradient of the voltage 40 and flows through resistor 30. It is seen in FIG. 6 that current 42 is advanced in phase with respect to the output 41 of slope detector 10a. In response to a noise-triggered sampling pulse 43, current 44 begins to flow into or out of capacitor 8 depending on the location of the noise impulse 45 on the waveform of input signal 46. In the present embodiment, the interpolation loop has an inherent loop delay on the order of microseconds as described in the previous embodiment and this loop delay is not explicitly shown in FIG. 4. Due to this inherent loop delay, the voltage developed by slope detector 10a at the moment switch 6 is opened represents the slope of the audio input signal immediately prior to the occurrence of the switching action. By using this starting voltage, linear interpolation proceeds until the switch is closed.

Amplifier 7 has a 0-dB amplification gain. The voltage delivered to output terminal 9 is therefore substantially equal to that developed in capacitor 8.

It is seen from the foregoing that in the second embodiment, the voltage-to-current converter or constant-current source is greatly simplified and there is no need to use a second sample-and-hold circuit which is employed in the aforesaid copending applications.

What is claimed is:

1. A noise reduction circuit having an input terminal to which an information signal is applied and an output terminal, comprising:
    means connected to said input terminal for detecting a noise impulse introduced in said information signal and generating therefrom a sampling pulse time-coincident with the portion of the signal affected by the impulse;
    a sample-and-hold circuit connected between said input and output terminals, the sample-and-hold circuit including a capacitor and a switch for passing said information signal to said output terminal in the absence of said sampling pulse;
    a slope detector connected to be responsive to a voltage developed in said capacitor for generating a voltage representative of the rate of variation of the capacitor voltage; and
    a voltage-to-current converter connected between the output of said slope detector and said capacitor for converting said voltage to a corresponding current and injecting said current to said capacitor when the rate of variation is positive and draining said current from said capacitor when said rate is negative.

2. A noise reduction circuit as claimed in claim 1, wherein said voltage-to-current converter comprises a constant current source.

3. A noise reduction circuit as claimed in claim 1, wherein said slope detector comprises a first differentiator connected to said sample-and-hold circuit and a second differentiator connected to said first differentiator, and means for combining outputs of said first and second differentiators and applying the combined output to said voltage-to-current converter.

4. A noise reduction circuit as claimed in claim 3, wherein said first differentiator has a time constant value greater than $1/(2\pi fm)$, where fm represents the highest frequency of said information signal so that the output of the first differentiator becomes substantially constant when said information signal has a frequency lower than $1/(2\pi T_1)$ where $T_1$ is said time constant value, and wherein said slope detector comprises an amplifier connected to be responsive to said combined differentiator output, the amplifier having such an amplification gain that when the frequency of said information signal is lower than $1/(2\pi T_1)$ a voltage at the output of said amplifier substantially equals a voltage developed in said capacitor, and wherein said voltage-to-current converter comprises an impedance element.

5. A noise reduction circuit as claimed in claim 4 further comprising a buffer amplifier connected between the output of said sample-and-hold circuit and said output terminal; and wherein the input of said slope detector is connected to the output of said buffer amplifier, and said sample-and-hold circuit includes an amplifier connected between said input terminal and said switch, the last-mentioned amplifier having a low output impedance which is presented to said capacitor in the absence of said sampling pulse to minimize the effect of said slope detector on said capacitor during the absence of said sampling pulse.

6. A noise reduction circuit as claimed in claim 1, further comprising delay means provided in a loop circuit in which said slope detector and voltage-to-current converter are connected.

* * * * *